(12) United States Patent  
Saruki et al.

(10) Patent No.: US 8,487,611 B2  
(45) Date of Patent: Jul. 16, 2013

(54) MAGNETIC SENSOR INCLUDING A BRIDGE CIRCUIT

(75) Inventors: Shunji Saruki, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 328 days.

(21) Appl. No.: 12/841,501

(22) Filed: Jul. 22, 2010

(65) Prior Publication Data

US 2011/0025319 A1   Feb. 3, 2011

(30) Foreign Application Priority Data

Jul. 31, 2009   (JP) ................................. 2009-179327

(51) Int. Cl.
*G01R 33/02* (2006.01)

(52) U.S. Cl.
USPC ........................................................... 324/252

(58) Field of Classification Search
USPC .................................... 324/252, 207.21, 250
See application file for complete search history.

(56) References Cited

U.S. PATENT DOCUMENTS

| | | | | |
|---|---|---|---|---|
| 4,192,005 A | * | 3/1980 | Kurtz ............................... | 702/98 |
| 4,490,803 A | * | 12/1984 | Briggs ............................. | 702/99 |
| 5,561,368 A | | 10/1996 | Dovek et al. | |
| 6,501,678 B1 | * | 12/2002 | Lenssen et al. ............... | 365/173 |
| 6,756,782 B2 | * | 6/2004 | Van Zon ....................... | 324/252 |
| 6,946,834 B2 | * | 9/2005 | Van Zon et al. .............. | 324/252 |
| 7,394,247 B1 | * | 7/2008 | Guo et al. ...................... | 324/252 |
| 7,714,694 B2 | * | 5/2010 | Landsberger et al. ............. | 338/9 |
| 7,861,597 B2 | * | 1/2011 | Kurtz et al. ..................... | 73/754 |
| 2008/0032158 A1 | * | 2/2008 | Sasaki ........................ | 428/811.2 |
| 2008/0116886 A1 | * | 5/2008 | Yamada et al. .......... | 324/207.21 |
| 2008/0169807 A1 | * | 7/2008 | Naito et al. .................... | 324/252 |

FOREIGN PATENT DOCUMENTS

| | | |
|---|---|---|
| JP | B2-3017061 | 3/2000 |
| JP | A-2006-029792 | 2/2006 |
| JP | A-2009-121858 | 6/2009 |

OTHER PUBLICATIONS

European Patent Office, Extended European Search Report of European Application No. 10 170 803.0, dated Oct. 22, 2010, pp. 1-6.

* cited by examiner

*Primary Examiner* — Huy Q Phan  
*Assistant Examiner* — Giovanni Astacio-Oquendo  
(74) *Attorney, Agent, or Firm* — Oliff & Berridge, PLC

(57) ABSTRACT

A magnetic sensor includes a bridge circuit with a first, a second, a third, and a fourth resistor annularly and electrically connected together in this order, and a compensation resistor. The compensation resistor is connected to a first point between the fourth resistor and the first resistor. The first to fourth resistors include a first to fourth tunnel magneto-resistance element, respectively. Each of the magnetization directions in the magnetization fixed layers in the second and fourth magneto resistance elements is opposite to the magnetization direction in the magnetization fixed layer in the first magneto resistance element. The magnetization direction in the magnetization fixed layer in the third magneto resistance element is the same as the magnetization direction in the magnetization fixed layer in the first magneto resistance element. The resistance of the compensation resistor varies with a period of 180 degrees with respect to a rotation angle of the external field.

10 Claims, 7 Drawing Sheets

MAGNETIC SENSOR INCLUDING A BRIDGE CIRCUIT

This application is based upon and claims the benefit of priority from Japanese patent application No. 2009-179327, filed on Jul. 31, 2009, the disclosure of which is incorporated herein in its entirety by reference.

TECHNICAL FIELD

The present invention relates to a magnetic sensor including a bridge circuit with magneto resistance elements.

BACKGROUND

Magneto resistance (MR) elements configured to exert magneto resistance effects are widely utilized as sensors for detecting a magnetic field because the electric resistance value of the MR elements vary in response to the external magnetic field. An example of such a sensor is a magnetic sensor including a bridge circuit with MR elements. Such magnetic sensors are disclosed in JP3017061B based on priority from U.S. Pat. No. 5,561,368A and JP2006-29792A.

FIG. 1 is a schematic diagram showing the configuration of the magnetic sensor described in JP3017061B. Magnetic sensor 100 includes first MR element 101, second MR element 102, third MR element 103, and fourth MR element 104.

First MR element 101 and second MR element 102 are connected together by an electrical conductor. Second MR element 102 and third MR element 103 are connected together by an electrical conductor. Third MR element 103 and fourth MR element 104 are connected together by an electrical conductor. Fourth MR element 104 and first MR element 101 are connected together by an electrical conductor. MR elements 101, 102, 103, and 104 form a bridge circuit.

Input leads 107 are connected to a point between second MR element 102 and third MR element 103 and to a point between fourth MR element 104 and first MR element 101. A voltage is applied between two input leads 107.

Output lead 108 is connected to a point between first MR element 101 and second MR element 102 and to a point between third MR element 103 and fourth MR element 104. The potential difference between two output leads 108 corresponds to an output from magnetic sensor 100.

Each of MR elements 101, 102, 103, and 104 includes a stack with ferromagnetic layer (free layer) 114 in which the magnetization direction varies in response to an external magnetic field, a magnetization fixed layer (pinned layer) 112 in which the magnetization direction is fixed with respect to the external magnetic field, a nonmagnetic intermediate layer (spacer layer) 113 sandwiched between magnetization fixed layer 112 and a ferromagnetic layer 114, and an antiferromagnetic layer (pinning layer) 111 configured to fix the magnetization direction in magnetization fixed layer 112. The stack is called a spin valve film. The magnetization in ferromagnetic layer 114 rotates freely in the film plane of the stack in response to the external magnetic field.

Magnetization direction 115 in the magnetization fixed layer in the first MR element is the same as magnetization direction 117 in the magnetization fixed layer in the third MR element. Furthermore, each of magnetization directions 115 and 117 in the magnetization fixed layers in the first and third MR elements is opposite to each of magnetization directions 116 and 118 in the magnetization fixed layers in the second and fourth MR elements.

In general, the electric resistance of the MR element varies depending on the angle between the magnetization direction in the magnetization fixed layer and the magnetization direction in the ferromagnetic layer. Since the magnetization direction in the ferromagnetic layer varies in response to the external magnetic field, the electric resistance of the MR element varies in response to the external magnetic field.

Thus, the potential difference (output value) between output terminal leads 108 in the bridge circuit varies depending on the direction of the external magnetic field. In the magnetic sensor, an output waveform corresponding to the rotation angle of the external magnetic field is generally shaped like a cosine or sine wave. The rotation angle of the external magnetic field as used herein refers to the angle (direction) of the rotation in the film plane of the stack of the MR element.

Since the output waveform from the magnetic sensor is estimated to be shaped like a cosine or sine wave, the direction of the external magnetic field can be calculated from the output value from the magnetic sensor.

To improve the accuracy of the magnetic sensor shown in FIG. 1, MR elements with a high magneto resistance ratio (MR ratio) are preferably utilized. An example of an MR element with a high MR ratio is a tunnel magneto-resistance element (TMR element) that utilizes a tunnel magneto-resistance effect. In the TMR element, the nonmagnetic intermediate layer includes an insulating layer. In the TMR element, a current is allowed to flow in a direction orthogonal to the film plane of the element. Thus, a tunnel current flows through the insulating layer.

However, the present inventors have clarified that the use of the TMR element may result in the following problems.

FIGS. 2A and 2B are graphs prepared by the present inventors. FIG. 2A shows the voltage dependence of the maximum and minimum values of the resistance of a TMR element. FIG. 2B shows the voltage dependence of the MR ratio of the TMR element. The resistance value and MR ratio of the TMR element depend greatly on the voltage applied to the TMR element. The MR ratio decreases with increasing voltage. Thus, a variation in the magnitude of the voltage applied to each of the TMR elements forming the bridge circuit causes the resistance characteristics of the TMR element to vary.

Hence, when the magnetization in the free layer rotates depending on the direction of the external magnetic field to cause the resistance value of each of the MR elements to vary, the magnitude of the voltage applied to the MR element varies. The resistance value of the TMR element further varies depending on the variation in the magnitude of the voltage.

Thus, the resistance value varies not only due to rotation of the magnetization in the free layer but also because of variation in the resistance value caused by the variation in the value of the voltage applied to the TMR element. As a result, the output waveform from the magnetic sensor deviates from a cosine or sine wave.

As described above, by using the magnetic sensor, the direction of the external magnetic field is calculated from the output value from the magnetic sensor based on the assumption that the output waveform will be shaped like a cosine or sine wave. Thus, the deviation of the output waveform from a cosine or sine wave may reduce the accuracy of the magnetic sensor.

As described above, the present inventors have found that the voltage dependence of the MR ratio of the TMR element may disadvantageously disturb the output waveform from the magnetic sensor, thus reducing the accuracy of the magnetic sensor.

SUMMARY

An object of the present invention is to provide a magnetic sensor allowing accuracy to be improved.

A magnetic sensor according to an aspect of the present invention includes a bridge circuit with a first resistor, a second resistor, a third resistor, and a fourth resistor annularly and electrically connected together in this order, and a compensation resistor. The compensation resistor is connected to a first point between the fourth resistor and the first resistor in the bridge circuit. A voltage is applied between a point located opposite the first point across the compensation resistor and a point which is located between the second resistor and the third resistor. The first, second, third, and fourth resistors include a first magneto resistance element, a second magneto resistance element, a third magneto resistance element, and a fourth magneto resistance element, respectively. Each of the magneto resistance elements is a tunnel magneto-resistance element including a magnetization fixed layer with a magnetization direction fixed with respect to an external magnetic field, a ferromagnetic layer with a magnetization direction rotating in response to the external magnetic field, and a nonmagnetic intermediate layer sandwiched between the magnetization fixed layer and the ferromagnetic layer and including an insulating layer. Each of the magnetization directions in the magnetization fixed layers in the second and fourth magneto resistance elements is opposite to the magnetization direction in the magnetization fixed layer in the first magneto resistance element. The magnetization direction in the magnetization fixed layer in the third magneto resistance element is the same as the magnetization direction in the magnetization fixed layer in the first magneto resistance element. The electric resistance of the compensation resistor varies with a period of 180 degrees with respect to a rotation angle of the external magnetic field.

The magnetic sensor configured as described above has an improved accuracy.

The above and other objects, features and advantages of the present invention will become apparent from the following description with reference to the accompanying drawings which illustrate examples of the present invention.

DESCRIPTION OF EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 3:
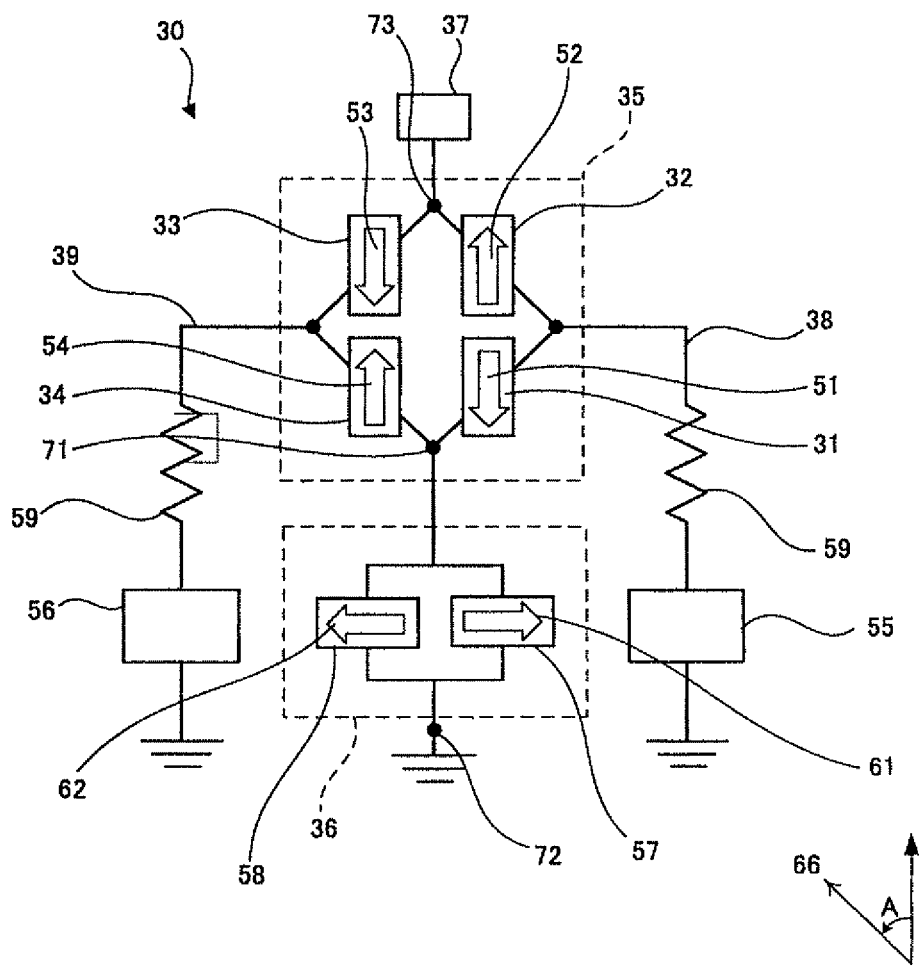
FIG. 3 is a schematic diagram of a magnetic sensor according to a first embodiment.

FIG. 3 is a schematic diagram showing the configuration of a magnetic sensor according to the first embodiment. Magnetic sensor 30 includes compensation resistor 36 and bridge circuit 35 with a first resistor, a second resistor, a third resistor, and a fourth resistor annularly and electrically connected together in this order.

In the present embodiment, the first to fourth resistors include first magneto resistance (MR) element 31, second MR element 32, third MR element 33, and fourth MR element 34, respectively. Compensation resistor 36 is connected to point (first point) 71 between fourth MR element 34 and first MR element 31.

While magnetic sensor 30 is in operation, a DC voltage is applied between point 72 located opposite the aforementioned first point 71 across compensation resistor 36 and point 73 which is located between second MR element 32 and third MR element 33. To apply the DC voltage, magnetic sensor 30 may include power source 37.

Magnetic sensor 30 includes first output line 38 connected between first MR element 31 and second MR element 32 and second output line 39 connected between third MR element 33 and fourth MR element 34.

Figure 4:
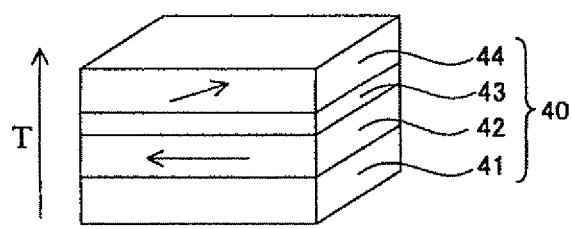
FIG. 4 is a schematic diagram showing an example of the configuration of the MR element.

First, second, third, and fourth MR elements 31, 32, 33, and 34 are TMR element configured to exert a tunnel magneto-resistance effect. FIG. 4 is a schematic diagram showing an example of the configuration of MR elements 31, 32, 33, and 34.

Each of MR elements 31, 32, 33, and 34 includes stack 40 with antiferromagnetic layer (pinning layer) 41, magnetization fixed layer (pinned layer) 42 in which a magnetization direction is fixed with respect to an external magnetic field, ferromagnetic layer (free layer) 44 in which the magnetization direction rotates in response to the external magnetic field, and nonmagnetic intermediate layer (spacer layer) 43 sandwiched between ferromagnetic layer 44 and magnetization fixed layer 42. Antiferromagnetic layer 41 is provided in contact with magnetization fixed layer 42. In the TMR element, nonmagnetic intermediate layer 43 includes an insulating layer. A current passing through the TMR element flows in direction T orthogonal to the film plane of stack 40.

The magnetization direction in magnetization fixed layer 42 is fixed by antiferromagnetic layer 41 and is thus prevented from rotating even with the external magnetic field. The magnetization in ferromagnetic layer 44 rotates in the film plane of stack 40 in response to the external magnetic field.

Magnetization direction 53 in the magnetization fixed layer in third MR element 33 is the same as magnetization direction 51 in the magnetization fixed layer in first MR element 31. Each of magnetization directions 52 and 54 in the magnetization fixed layers in second and fourth MR elements 32 and 34 is opposite to magnetization direction 51 in the magnetization fixed layer in first MR element 31.

In an example of the present embodiment, first output line 38 is connected to first measurement instrument 55 configured to measure the potential between the first resistor and the second resistor. Second output line 39 is connected to second measurement instrument 56 configured to measure the potential between the third resistor and the fourth resistor.

While magnetic sensor 30 is in operation, the potentials on first output line 38 and second output line 39 are measured. The potential difference between first output line 38 and second output line 39 is then calculated from the measured values.

The present invention is not limited to the above-described embodiment. The potential difference between first output line 38 and second output line 39 may be measured directly with a voltmeter. Alternatively, the potential difference between first output line 38 and second output line 39 may be amplified by a differential amplification circuit so that the amplified signal can be used as an output value.

Each of the first to fourth resistors may include one or more MR elements. The plurality of MR elements forming each resistor are connected together in series. The magnetizations in magnetization fixed layers 42 in the plurality of MR elements forming each resistor are set to the same direction. The magnetizations in the magnetization fixed layers in the MR elements forming the adjacent resistors are opposite to each other.

As described above, when each resistor includes a plurality of MR elements, variations in resistance characteristics among the MR elements are reduced, that is, averaged. Thus, the accuracy of the magnetic sensor can be improved. The number of MR elements (hereinafter referred to as the number of junctions) provided in each resistor may be optionally set in accordance with the resistance characteristics of the magneto resistance elements.

The first to four resistors preferably include the same number of MR elements with the same configuration. This makes the resistance characteristics of the resistors forming bridge circuit 35 substantially the same. Thus, the accuracy of magnetic sensor 30 can be improved.

The resistance of compensation resistor 36 varies with a period of 180 degrees with respect to the rotation angle of the external magnetic field. Here, in the specification, rotation angle A of external magnetic field 66 refers to the angle or orientation of the rotation in the film plane of stack 40. Rotation angle A is defined to rotate counterclockwise in the figure and to increase with reference to the magnetization direction in the magnetization fixed layer in the second MR element 32 when the magnetization direction is defined as 0° (see also FIG. 3).

FIG. 3 shows an example of compensation resistor 36. Compensation resistor 36 shown in FIG. 3 includes a fifth resistor and a sixth resistor connected in parallel with the fifth resistor. The fifth and sixth resistors preferably include fifth MR element 57 and sixth MR element 58, respectively.

As described above, each of the fifth and sixth MR elements 57 and 58 includes a stack with an antiferromagnetic layer, a magnetization fixed layer, a nonmagnetic intermediate layer, and a ferromagnetic layer. However, each of fifth and sixth MR elements 57 and 58 is not limited to a TMR element but may be any element. For example, a giant magneto-resistance element with a nonmagnetic intermediate layer including a conductive layer may be used.

Magnetization direction 61 in the magnetization fixed layer in fifth MR element 57 is opposite to magnetization direction 62 in the magnetization fixed layer in sixth MR element 58. Thus, the electric resistance of compensation resistor 36 varies with a period of 180° with respect to the direction of the external magnetic field.

Each of magnetization directions 61 and 62 in the magnetization fixed layers in fifth and sixth MR elements 57 and 58 is orthogonal to each of magnetization directions 51 to 54 in the magnetization fixed layers in first to fourth MR elements 31 to 34.

In magnetic sensor 30 according to the present embodiment, the application of an external magnetic field sets the magnetizations in the ferromagnetic layers in the MR elements to the same direction as that of the external magnetic field. When rotation angle A of the external magnetic field is generally 90 and 270 degrees, external magnetic field 66 is substantially orthogonal to each of magnetization directions 51 to 54 in the magnetization fixed layers in first to fourth MR elements 31 to 34. In this case, the resistance values of first to fourth MR elements 31 to 34 are substantially equal. Thus, the potential difference between first output line 38 and second output line 39 is substantially zero.

External magnetic field 66 with a rotation angle of 0 degree is set to the same direction as that of the magnetization in the magnetization fixed layer in second and fourth MR elements 32 and 34. In this case, the resistance values of first and third MR elements 31 and 33 are maximized (maximal values), whereas the resistance values of second and fourth MR elements 32 and 34 are minimized (minimal values). As a result, the output value of magnetic sensor 30 is maximized. Furthermore, when the rotation angle of external magnetic field 66 is 180 degrees, the output value of magnetic sensor 30 is minimized.

In this manner, an output waveform from magnetic sensor 30 is generally shaped like a cosine wave with respect to the angle of the external magnetic field. This characteristic can be utilized to back-calculate the rotation angle of external magnetic field 66 from the output value from magnetic sensor 30.

Figure 1:
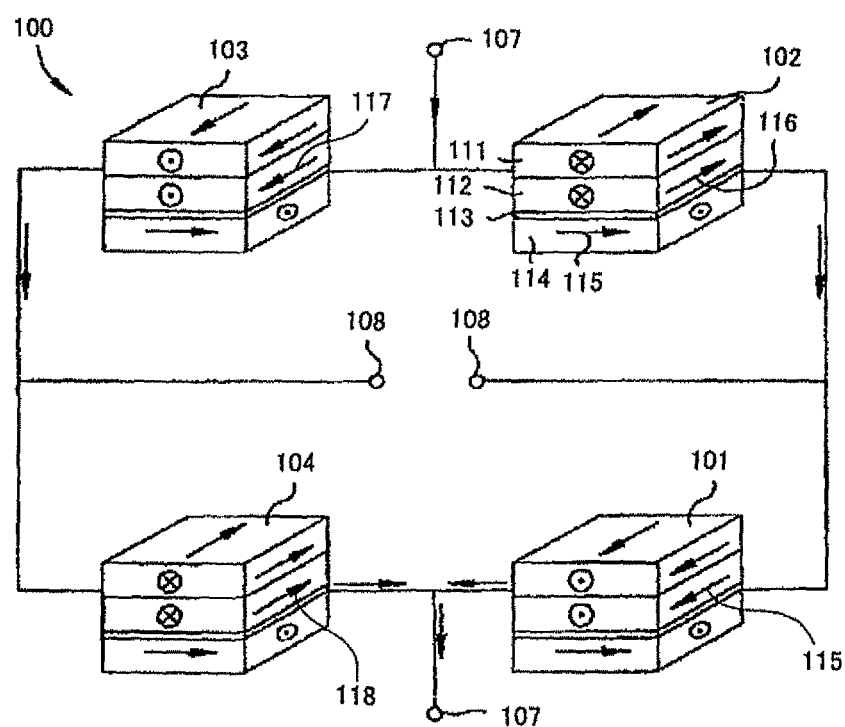
FIG. 1 is a schematic diagram showing the configuration of a magnetic sensor according to the related art which includes a bridge circuit with MR elements.
Figure 2A:
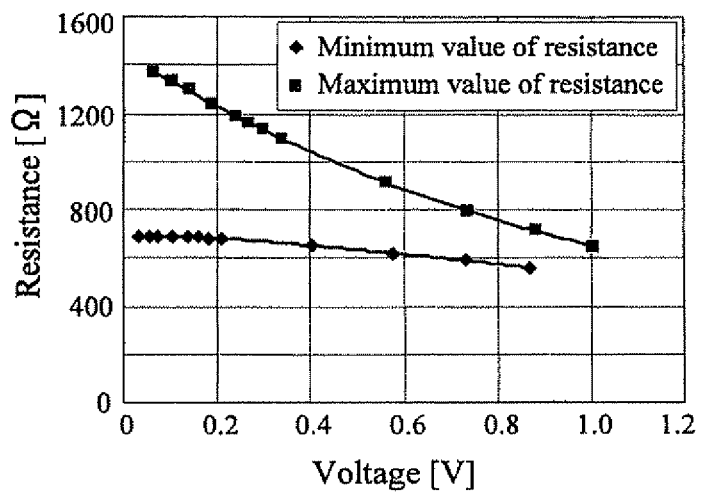
FIG. 2A is a graph showing the voltage dependence of the maximum and minimum values of resistance of a TMR element.
Figure 2B:
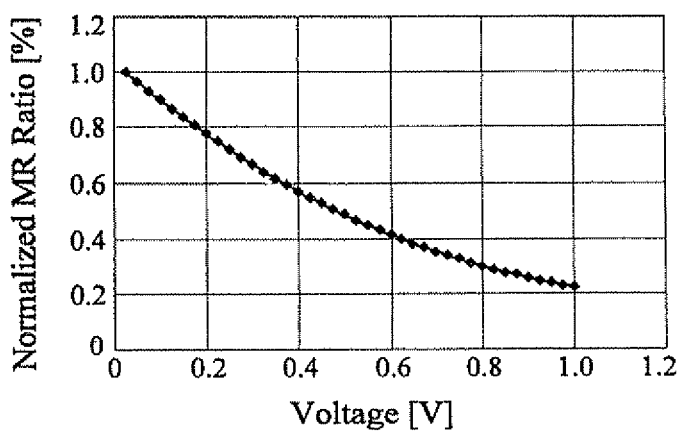
FIG. 2B is a graph showing the voltage dependence of the MR ratio of the TMR element.

Now, the advantages of magnetic sensor 30 that includes compensation resistor 36 of the present embodiment will be described. If TMR elements are used in a conventional magnetic sensor that does not include compensation resistor 36, the dependence of the resistance value on the voltage may cause the output waveform from the magnetic sensor to deviate from a cosine wave as shown in FIG. 2A and FIG. 2B. The deviation of the output waveform may increase the detection error in the magnetic sensor.

Figure 5:
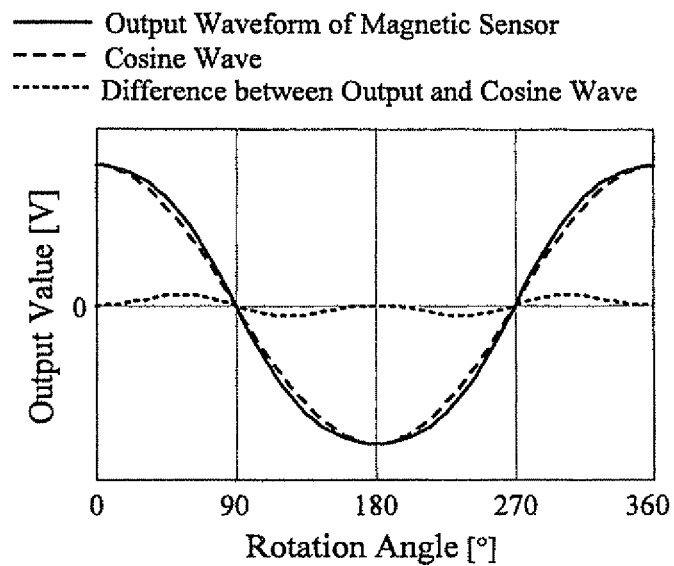
FIG. 5 is a graph showing an output waveform from a conventional magnetic sensor and the difference (deviation) of the output waveform from a cosine wave.

FIG. 5 is a graph showing an output waveform from a conventional magnetic sensor and the deviation of the output waveform from a cosine wave. When the rotation angle of the external magnetic field is generally 90 and 270 degrees, the resistance values of the first to fourth MR elements are substantially equal. Thus, the output value from the magnetic sensor is substantially zero, thus allowing a reduction in a detection error in the magnetic sensor. Furthermore, in the conventional magnetic sensor, when the rotation angle of the external magnetic field is 0 and 180 degrees, the output value from the magnetic sensor is maximal, thus suppressing a decrease in the accuracy of the magnetic sensor. Thus, in regions other than those in which the rotation angle of the external magnetic field is 0 degree, 90 degrees, 180 degrees, and 270 degrees, respectively, the output waveform from the magnetic sensor deviates significantly from a cosine wave.

Thus, the present inventors have found that the absolute value of deviation of the output value generally varies with a period of 180 degrees with respect to the rotation angle of the external magnetic field (see FIG. 5). Thus, when the value of the voltage applied to bridge circuit 35 is varied with a period of 180 degrees with respect to the rotation angle of the external magnetic field, the output value from the magnetic sensor can be made closer to the one corresponding to a cosine value.

Figure 6:
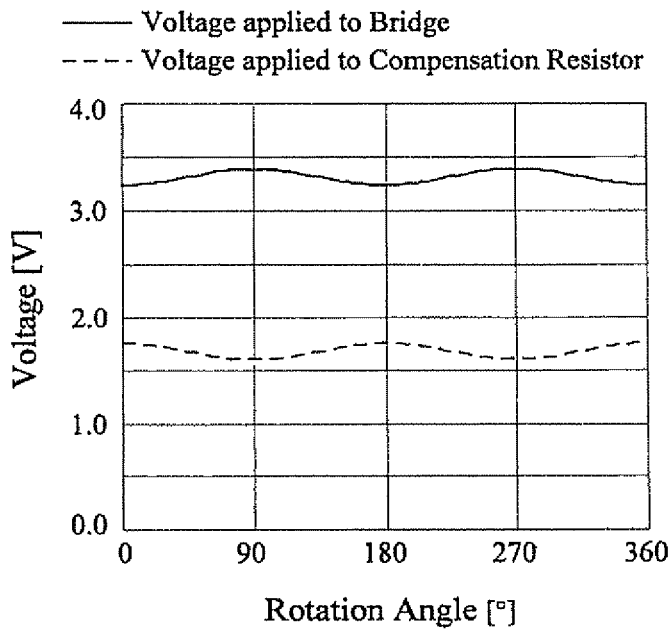
FIG. 6 is a graph showing the external magnetic field dependence of the voltage applied to a bridge circuit and the value of a voltage applied to a compensation resistor according to the first embodiment.

In the present embodiment, the resistance value of compensation resistor 36 varies with a period of 180 degrees depending on the rotation angle of the external magnetic field. Thus, as shown in FIG. 6, the values of the voltages applied to bridge circuit 35 and compensation resistor 36 vary with a period of 180 degrees with respect to the rotation angle of the external magnetic field. In this manner, an error in the magnetic sensor can be reduced.

For example, the phase and amplitude of the resistance value of compensation resistor 36 are appropriately set in accordance with the output waveform from the magnetic sensor that does not include compensation resistor 36. The phase and amplitude of the resistance value of compensation resistor 36 are set so as to make the output waveform from the magnetic sensor as similar to a cosine wave (or a sine wave) as possible.

The resistance value of compensation resistor 36 preferably varies continuously in association with the rotation angle of the external magnetic field (see FIG. 6). Furthermore, with the symmetry of the output waveform taken into account, the resistance value of the compensation resistor preferably has a maximal value when the rotation angle of the external magnetic field is generally 0 and 180 degrees. Furthermore, the resistance value of the compensation resistor preferably has a minimal value when the rotation angle of the external magnetic field is generally 90 and 270 degrees. However, the present invention is not limited this configuration.

Each of the fifth and sixth resistors which construct the compensation resistor may include a single MR element or a plurality of MR elements connected together in series. The number of MR elements 57 and 58 forming each resistor and connected together in series is hereinafter referred to as the number of junctions. The number of junctions of MR elements 57 and 58 is optionally determined depending on the output waveform from bridge circuit 35.

The junction numbers of the fifth and sixth resistors are desirably the same so that the electric resistance of compensation resistor 36 varies with a period of 180 degrees with respect to the external magnetic field.

Figure 7:
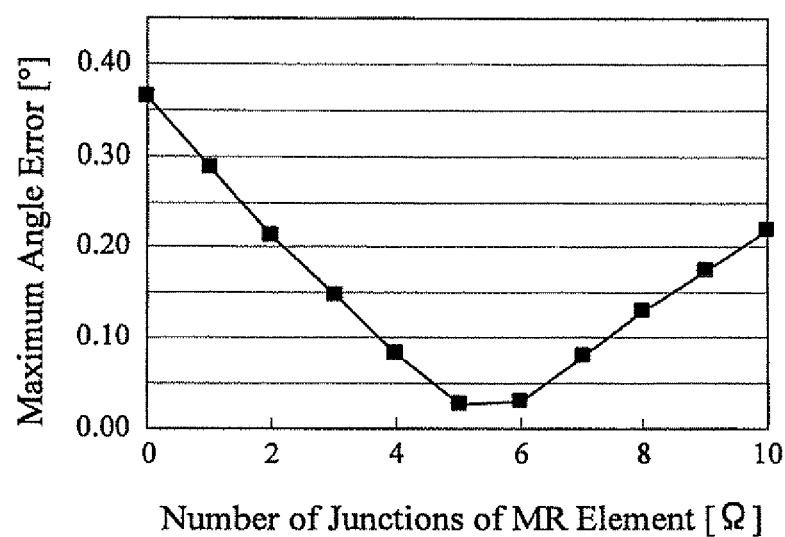
FIG. 7 is a graph showing the relationship between the number of junctions of MR elements in the compensation resistor and the angle error in the magnetic sensor.

FIG. 7 is a graph showing the relationship between the junction number of MR elements 57 and 58 forming compensation resistor 36 and the maximum angle error in magnetic sensor 30. The term "angle error" as used herein refers to the error between the angle of the external magnetic field calculated from the output value from the magnetic sensor and the actual angle of the external magnetic field. Moreover, the term "maximum angle error" refers to the maximum value of the angle error in the magnetic sensor obtained if the rotation angle of the external magnetic field is appropriately varied. In the present example, the DC voltage applied by power source 37 is 5V.

In the graph shown in FIG. 7, the horizontal axis indicates the number of junctions of MR elements 57 and 58. The longitudinal axis indicates the maximum angle error in magnetic sensor 30. A zero point on the horizontal axis indicates the result for the conventional magnetic sensor that does not include compensation resistor 36. In the graph, the number of junctions of MR elements 31 to 34 forming the first to fourth resistors is 10.

The graph indicates that the maximum error in the magnetic sensor with compensation resistor 36 is smaller than that in the conventional magnetic sensor. When the number of junctions is at least 1 and at most 10, the magnetic sensor that includes compensation resistor 36 is particularly more advantageous than the conventional magnetic sensor. Moreover, because of the reduced maximum error in the magnetic sensor, the number of junctions is more preferably 5 or 6.

As described above, each of magnetization directions 61 and 62 in the magnetization fixed layers in fifth and sixth MR elements 57 and 58 is preferably substantially orthogonal to each of magnetization directions 51 to 54 in the magnetization fixed layers in first to fourth MR elements 31 to 34. However, provided that the output waveform from the magnetic sensor can be made more similar to a cosine wave to improve the accuracy of the magnetic sensor, each of magnetization directions 61 and 62 need not necessarily be orthogonal to each of magnetization directions 51 to 54.

Fifth and sixth MR elements 57 and 58 preferably have the same configuration, This allows fifth and sixth MR elements 57 and 58 to have substantially equal resistance characteristics. Thus, the electric resistance of compensation resistor 36 can be easily varied with a period of 180 degrees with respect to the external magnetic field.

Resistor 59 with a large resistance value is preferably connected to each of first and second output lines 38 and 39. This allows a reduction in current flowing though each of first and second output lines 38 and 39.

In the first embodiment, compensation resistor 36 includes MR elements 57 and 58 connected in parallel. However, compensation resistor 36 is not limited to this structure. Compensation resistor 36 may have its resistance value varied with a period of 180 degrees with respect to the angle of the external magnetic field so that the output waveform is similar to a cosine wave.

Figure 8:
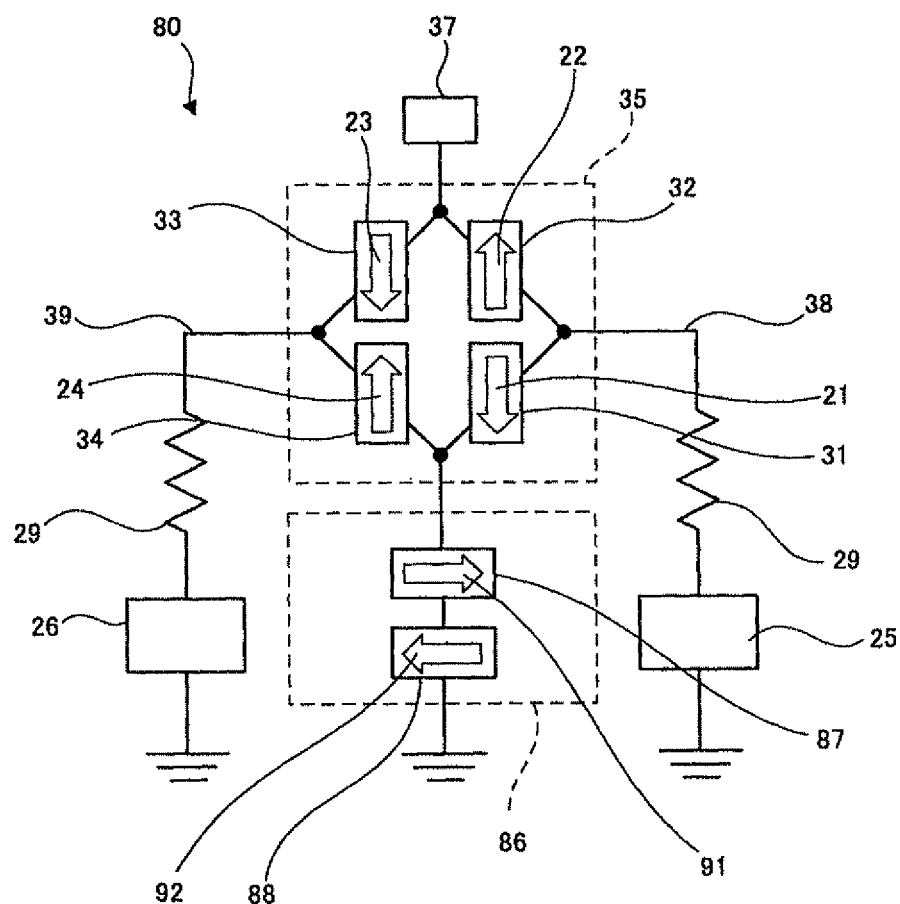
FIG. 8 is a schematic diagram showing a magnetic sensor according to a second embodiment.

FIG. 8 is a schematic diagram showing the configuration of a magnetic sensor according to a second embodiment. Magnetic sensor 80 according to the second embodiment is different from the magnetic sensor according to the first embodiment only in the configuration of a compensation resistor. The remaining part of the configuration of magnetic sensor 80 according to the second embodiment is similar to that of the magnetic sensor according to the first embodiment. In particular, the second embodiment also includes: first magneto resistance (MR) element 31, second MR element 32, third MR element 33, fourth MR element 34, bridge circuit 35, power source 37, first output line 38, and second output line 39.

In the second embodiment, compensation resistor 86 includes a fifth resistor and a sixth resistor connected together in series; the fifth resistor includes fifth MR element 87, and the sixth resistor includes sixth MR element 88. Each of the fifth and sixth resistors includes one or more MR elements 87 and 88.

Magnetization direction 91 in the magnetization fixed layer in fifth MR element 87 is opposite to magnetization direction 92 in the magnetization fixed layer in sixth MR element 88. Thus, the electric resistance of compensation resistor 86 varies with a period of substantially 180 degrees with respect to the external magnetic field.

Figure 9:
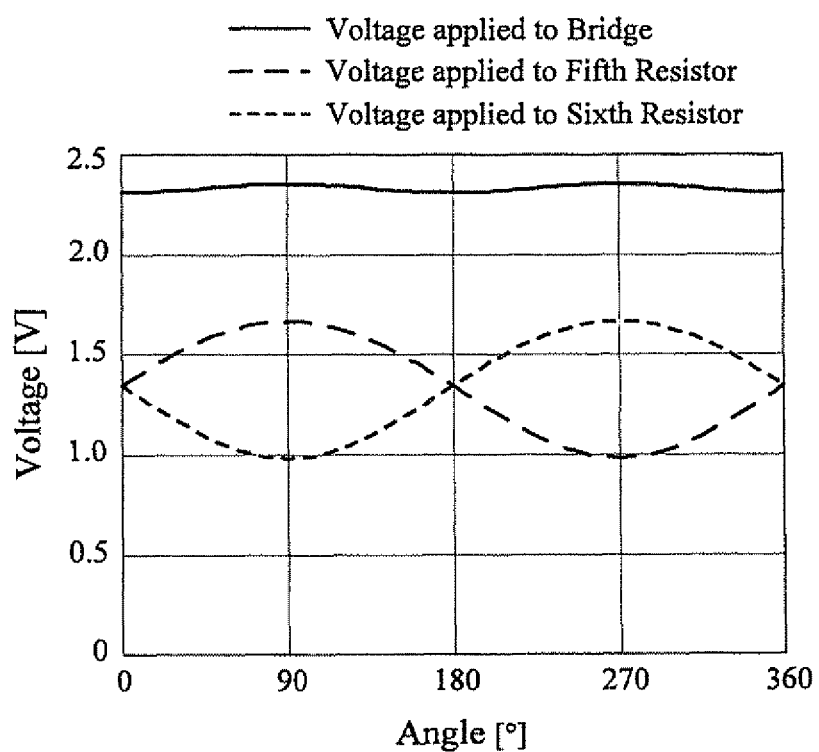
FIG. 9 is a graph showing the magnitude of a voltage applied to a fifth resistor and a sixth resistor and the magnitude of a voltage applied to bridge circuit according to the second embodiment.

FIG. 9 is a graph showing the magnitudes of voltages applied to fifth and sixth MR elements 87 and 88 and the magnitude of a voltage applied to bridge circuit 35. In this measurement, the voltage of power source 37 was set to 5V.

The series connection between fifth and sixth resistors allows the voltage of compensation resistor 86 to vary with a period of 180 degrees with respect to the direction of the external magnetic field. Thus, the voltage applied to bridge circuit 35 varies with a period of 180 degrees. This enables a reduction in detection error in the magnetic sensor as is the case with the first embodiment.

As in the case of the magnetic sensor according to the first embodiment, the configuration and number of MR elements 87 and 88 which construct each of the fifth and sixth resistors are preferably the same for both the fifth and sixth resistors.

Furthermore, each of magnetization directions 91 and 92 in the magnetization fixed layers in fifth and sixth MR elements 87 and 88 is preferably orthogonal to each of magnetization directions 21 to 24 in the magnetization fixed layers in first to fourth MR elements 31 to 34. However, the present invention is not necessarily limited to this configuration.

As is the case with the magnetic sensor according to the first embodiment, even if the angle between each of magnetization directions 91 and 92 in the magnetization fixed layers in fifth and sixth MR elements 87 and 88 and each of magnetization directions 21 to 24 in the magnetization fixed layers in first to fourth MR elements 31 to 34 is not 90 degrees, the output waveform from the magnetic sensor can be made similar to a cosine wave.

In the embodiments, the magnetic sensor including single bridge circuit 35 has been described in detail. However, the magnetic sensor may include a plurality of bridge circuits. For example, the magnetic sensor preferably includes two bridge circuits similar to bridge circuit 35 described in the first embodiment.

Each of the magnetization directions in the magnetization fixed layers in the MR elements forming one of the two bridge circuits is preferably orthogonal to each of the magnetization directions in the magnetization fixed layers in the corresponding MR elements forming the other bridge circuit. Thus, an output waveform from one of the bridge circuits is generally shaped like a cosine wave, whereas an output waveform from the other bridge circuit is generally shaped like a sine wave.

The output waveform obtained from one bridge circuit is a two-valued function for the angle of the external magnetic field. However, when the phase of the output waveform from one bridge circuit is shifted with the phase of the output waveform from the other bridge circuit, the rotation angle of the external magnetic field can be uniquely determined from the output values from the two bridge circuits.

Furthermore, since the two bridge circuits offer a sine wave and a cosine wave, the rotation angle of the external magnetic field can be easily measured by calculating the arc tangent of the ratio of the two output values.

The present invention is not limited to the above-described aspects. For example, each of the magnetization directions in the magnetization fixed layers in the MR elements which form one of the bridge circuits only needs to deviate from each of the magnetization directions in the magnetization fixed layers in the MR elements which form the other bridge circuit. Thus, the direction of the external magnetic field can be uniquely determined from the output values from the two bridge circuits.

The magnetic sensor described above in the embodiments is suitably utilized as an angle sensor configured to detect the rotation angle of, for example, a steering wheel in a vehicle. Such an angle sensor includes the above-described magnetic sensor and a magnet. The magnet is provided opposite the magnetic sensor.

The magnetic sensor and the magnet are configured so as to be rotatable relative to each other. That is, the magnetic sensor may be configured so as to be rotatable or the magnet may be configured so as to be rotatable.

A variation in the relative angle between the magnetic sensor and the magnet varies the direction of a magnetic field applied to the magnetic sensor. An output value from the magnetic sensor varies depending on the angle of the magnetic field from the magnet. The relative angle between the magnet and the magnetic sensor is measured based on the variation in output value.

Furthermore, the above-described magnetic sensor may utilize geomagnetism to measure the rotation angle. In this case, the angle sensor need not include any magnet.

While preferred embodiments of the present invention have been described using specific terms, such description is for illustrative purposes only, and it is to be understood that changes and variations may be made without departing from the spirit or scope of the following claims.

The invention claimed is:

1. A magnetic sensor comprising:
a bridge circuit with a first resistor, a second resistor, a third resistor, and a fourth resistor annularly and electrically connected together in this order;
a compensation resistor, one end of the compensation resistor connected to a point at which the fourth resistor is connected with the first resistor, and the compensation resistor includes a fifth resistor and a sixth resistor connected in parallel with the fifth resistor, wherein:
a voltage is applied between another end of the compensation resistor and a point at which the second resistor is connected with the third resistor,
the first, second, third, and fourth resistors comprise a first magneto resistance element, a second magneto resistance element, a third magneto resistance element, and a fourth magneto resistance element, respectively, and each of the magneto resistance elements is a tunnel magneto-resistance element comprising a magnetization fixed layer with a magnetization direction fixed with respect to an external magnetic field, a ferromagnetic layer with a magnetization direction rotating in response to the external magnetic field, and an insulating layer sandwiched between the magnetization fixed layer and the ferromagnetic layer,
each of the magnetization directions in the magnetization fixed layers in the second and the fourth magneto resistance elements is opposite to the magnetization direction in the magnetization fixed layer in the first magneto resistance element,
the magnetization direction in the magnetization fixed layer in the third magneto resistance element is the same as the magnetization direction in the magnetization fixed layer in the first magneto resistance element,
an electric resistance of the compensation resistor varies with a period of 180 degrees with respect to a rotation angle of the external magnetic field,
the fifth and sixth resistors comprise a fifth magneto resistance element and a sixth magneto resistance element, respectively, and each of the magneto resistance elements comprises a magnetization fixed layer with a magnetization direction fixed with respect to the external magnetic field, a ferromagnetic layer with a magnetization direction rotating in response to the external magnetic field, and a nonmagnetic intermediate layer sandwiched between the magnetization fixed layer and the ferromagnetic layer, and
the magnetization direction in the magnetization fixed layer in the fifth magneto resistance element is opposite to the magnetization direction in the magnetization fixed layer in the sixth magneto resistance element.

2. The magnetic sensor according to claim 1, wherein the fifth resistor comprises a plurality of the fifth magneto resistance elements connected together in series, and
the sixth resistor comprises a plurality of the sixth magneto resistance elements connected together in series.

3. The magnetic sensor according to claim 2, wherein the total number of the fifth magneto resistance elements is the same as the total number of the sixth magneto resistance elements.

4. The magnetic sensor according to claim 3, wherein the total number of the fifth magneto resistance elements is at least 2 and at most 10, and the total number of the sixth magneto resistance elements is at least 2 and at most 10.

5. The magnetic sensor according to claim 1 wherein each of the magnetization directions in the magnetization fixed layers in the fifth and sixth magneto resistance elements is orthogonal to each of the magnetization directions in the magnetization fixed layers in the first, second, third, and fourth magneto resistance elements.

6. The magnetic sensor according to claim 1, further comprising a measurement instrument configured to measure a potential difference between a first point and a second point, the first point being a point at which the first resistor is connected with the second resistor, the second point being a point at which the third resistor is connected with the fourth resistor.

7. A magnetic sensor comprising:
a bridge circuit with a first resistor, a second resistor, a third resistor, and a fourth resistor annularly and electrically connected together in this order; and
a compensation resistor, one end of the compensation resistor connected to a point at which the fourth resistor is connected with the first resistor, and including a fifth resistor and a sixth resistor connected in series with the fifth resistor, wherein:
a voltage is applied between another end of the compensation resistor and a point at which the second resistor is connected with the third resistor,
the first, second, third, and fourth resistors comprise a first magneto resistance element, a second magneto resistance element, a third magneto resistance element, and a fourth magneto resistance element, respectively, and each of the magneto resistance elements is a tunnel magneto-resistance element comprising a magnetization fixed layer with a magnetization direction fixed with respect to an external magnetic field, a ferromagnetic layer with a magnetization direction rotating in response to the external magnetic field, and an insulating layer sandwiched between the magnetization fixed layer and the ferromagnetic layer,
each of the magnetization directions in the magnetization fixed layers in the second and the fourth magneto resistance elements is opposite to the magnetization direction in the magnetization fixed layer in the first magneto resistance element
the magnetization direction in the magnetization fixed layer in the third magneto resistance element is the same as the magnetization direction in the magnetization fixed layer in the first magneto resistance element,
an electric resistance of the compensation resistor varies with a period of 180 degrees with respect to a rotation angle of the external magnetic field,
the fifth and sixth resistors comprise a fifth magneto resistance element and a sixth magneto resistance element, respectively, and each of the magneto resistance elements comprises a magnetization fixed layer with a magnetization direction fixed with respect to the external magnetic field, a ferromagnetic layer with a magnetization direction rotating in response to the external magnetic field, and a nonmagnetic intermediate layer sandwiched between the magnetization fixed layer and the ferromagnetic layer, and
the magnetization direction in the magnetization fixed layer in the fifth magneto resistance element is opposite to the magnetization direction in the magnetization fixed layer in the sixth magneto resistance element.

8. The magnetic sensor according to claim 7, wherein the fifth resistor comprises a plurality of the fifth magneto resistance elements connected together in series, and the sixth resistor comprises a plurality of the sixth magneto resistance elements connected together in series.

9. The magnetic sensor according to claim 8, wherein the total number of the fifth magneto resistance elements is the same as the total number of the sixth magneto resistance elements.

10. The magnetic sensor according to claim 7, wherein each of the magnetization directions in the magnetization fixed layers in the fifth and sixth magneto resistance elements is orthogonal to each of the magnetization directions in the magnetization fixed layers in the first, second, third, and fourth magneto resistance elements.

* * * * *